(12) United States Patent
Jun

(10) Patent No.: US 10,008,533 B2
(45) Date of Patent: Jun. 26, 2018

(54) SEMICONDUCTOR PACKAGE

(71) Applicant: Hyunsu Jun, Seongnam-si (KR)

(72) Inventor: Hyunsu Jun, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/346,929

(22) Filed: Nov. 9, 2016

(65) Prior Publication Data

US 2017/0154913 A1    Jun. 1, 2017

(30) Foreign Application Priority Data

Dec. 1, 2015    (KR) ........................ 10-2015-0170106

(51) Int. Cl.
*H01L 31/0203*    (2014.01)
*H01L 27/146*    (2006.01)

(52) U.S. Cl.
CPC .... *H01L 27/14634* (2013.01); *H01L 27/1469* (2013.01); *H01L 27/14618* (2013.01); *H01L 27/14621* (2013.01); *H01L 27/14627* (2013.01); *H01L 27/14636* (2013.01)

(58) Field of Classification Search
CPC ......... H01L 27/14618; H01L 27/14634; H01L 27/1462
See application file for complete search history.

(56) References Cited

U.S. PATENT DOCUMENTS

| | | | |
|---|---|---|---|
| 6,266,197 B1 * | 7/2001 | Glenn | ...................... H01L 24/97 348/E5.028 |
| 6,521,881 B2 | 2/2003 | Tu et al. | |
| 6,566,745 B1 * | 5/2003 | Beyne | ............... H01L 27/14618 257/431 |
| 6,686,588 B1 * | 2/2004 | Webster | .................. H01L 24/97 250/216 |
| 7,368,695 B2 | 5/2008 | Kang et al. | |
| 7,423,335 B2 | 9/2008 | Yang et al. | |
| 7,429,787 B2 | 9/2008 | Karnezos et al. | |
| 7,616,250 B2 | 11/2009 | Watanabe et al. | |
| 8,564,702 B2 | 10/2013 | Takagi et al. | |

(Continued)

FOREIGN PATENT DOCUMENTS

| | | |
|---|---|---|
| JP | 3502063 B2 | 12/2003 |
| JP | 2009026807 A | 2/2009 |

(Continued)

*Primary Examiner* — Marc Armand
*Assistant Examiner* — Sarah Salerno
(74) *Attorney, Agent, or Firm* — Volentine, Whitt & Francos, PLLC

(57) ABSTRACT

A semiconductor package device includes a first semiconductor package including a first package substrate and a semiconductor chip stacked on the first package substrate, and a second semiconductor package stacked on the first semiconductor package. The second semiconductor package includes a second package substrate, an image sensor chip stacked on the second package substrate, and a transparent substrate disposed on the image sensor chip. The first semiconductor chip may include a semiconductor memory device, a digital signal processor (DSP), an application specific integrated circuit (ASIC), and/or an image sensor driver circuit and may transfer, process and/or store signals output from the image sensor chip.

20 Claims, 14 Drawing Sheets

(56) References Cited

U.S. PATENT DOCUMENTS

| | | | |
|---|---|---|---|
| 2006/0221225 A1* | 10/2006 | Tsukamoto | H01L 27/14618 348/340 |
| 2006/0261458 A1 | 11/2006 | Paek et al. | |
| 2009/0224344 A1 | 9/2009 | Huang et al. | |
| 2014/0264699 A1 | 9/2014 | Ryu et al. | |
| 2016/0260761 A1* | 9/2016 | Jun | H01L 27/14618 |

FOREIGN PATENT DOCUMENTS

| | | |
|---|---|---|
| JP | 2014-0179470 A | 9/2014 |
| KR | 100428950 B1 | 4/2004 |
| KR | 100784103 B1 | 12/2007 |

\* cited by examiner

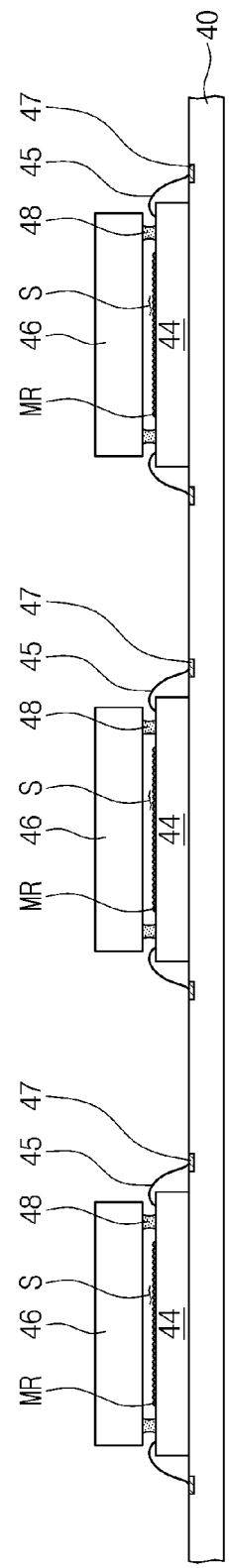
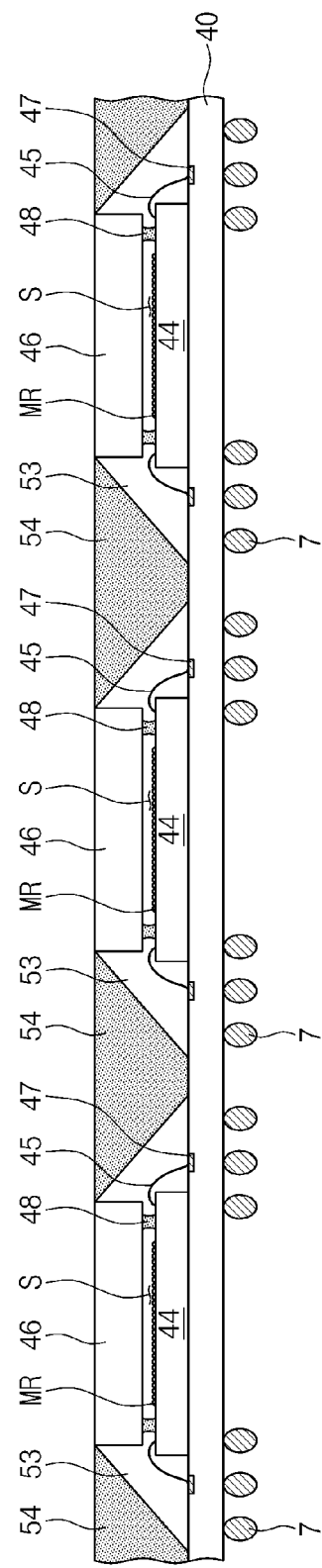

SEMICONDUCTOR PACKAGE

This U.S. non-provisional patent application claims priority under 35 U.S.C. § 119 to Korean Patent Application No. 10-2015-0170106, filed on Dec. 1, 2015, in the Korean Intellectual Property Office, the disclosure of which is hereby incorporated by reference in its entirety.

BACKGROUND

The inventive concept relates to semiconductor device packages and, more particularly, to semiconductor device packages including an image sensor.

Image sensors may be categorized as any one of charge coupled device (CCD) image sensors and complementary metal-oxide-semiconductor (CMOS) image sensors. These image sensors may be applied to various electronic products such as a mobile phone, a digital camera, an optical mouse, a monitoring camera, and a biometric device. As small and multi-functional electronic products are being demanded, it may be required that semiconductor packages including image sensors have excellent characteristics such as a small size, high-density, low-power, multi-function, high-speed data processing, high-reliability, low-costs, and clear image quality. Research into various aspects of semiconductor device manufacturing and packaging technologies is being carried out to satisfy these requirements.

SUMMARY

According to an aspect of the inventive concept, there is provided a semiconductor package device including a first semiconductor package comprising a first package substrate and a semiconductor chip stacked on the first package substrate, and a second semiconductor package stacked on the first semiconductor package, the second semiconductor package comprising a second package substrate, an image sensor chip stacked on the second package substrate, a transparent substrate disposed on the image sensor chip, a pattern of adhesive interposed between the image sensor chip and the transparent substrate, and a resin layer disposed on the second package substrate and extending around the transparent substrate. The adhesive pattern has an inner side and an outer side, a bottom surface in contact with the image sensor chip, and a top surface in contact with the transparent substrate. Also, a width of the top surface of the adhesive pattern, from the inner side to the outer side of the adhesive pattern, is greater than a width of the bottom surface of the adhesive pattern from the inner side to the outer side of the adhesive pattern, as both taken in a common horizontal direction perpendicular to a vertical direction in which the image sensor chip is stacked on the second package substrate.

According to another aspect of the inventive concept, there is provided a semiconductor package device including a semiconductor chip stacked on the first package substrate, and a second semiconductor package stacked on the first semiconductor package, the second semiconductor package comprising a second package substrate, an image sensor chip stacked on the second package substrate, a transparent substrate disposed on the image sensor chip and having a width that is greater than a width of the image sensor chip, an adhesive pattern interposed between the image sensor chip and the transparent substrate, and a resin layer covering a side surface of the image sensor chip and an outer side surface of the adhesive pattern. The resin layer has a first portion interposed between the image sensor chip and the transparent substrate, and a second portion interposed between the second package substrate and the transparent substrate. Also, a thickness of the second portion of the resin layer is equal to a distance between the second package substrate and the transparent substrate, in a vertical direction in which the image sensor chip is stacked on the second package substrate.

According to still another aspect of the inventive concept, there is provided a semiconductor package device including a first semiconductor package and a second semiconductor package stacked on and physically connected to the first semiconductor package, the first semiconductor package comprising a first printed circuit board (PCB) having a top surface and a bottom surface, a first semiconductor chip disposed on and flip-chip bonded to the top surface of the first PCB such that an active surface of the semiconductor chip faces the top surface of the first PCB, and connection terminals disposed laterally of the first semiconductor chip and electrically connected to the first PCB at the top surface of the first PCB, and the second semiconductor package comprising a second printed circuit board (PCB) having a top surface and a bottom surface that faces the first semiconductor package and at which the second PCB is electrically connected to the connection terminals of the first semiconductor package, an image sensor chip disposed on the second PCB and electrically connected to the second PCB, and a transparent substrate disposed over the image sensor chip as spaced vertically therefrom. The first semiconductor chip comprises at least one semiconductor device selected from the group consisting of a semiconductor memory device, a digital signal processor (DSP), an application specific integrated circuit (ASIC), and an image sensor driver circuit. Also, the first semiconductor chip is electrically connected to the image sensor chip via the first PCB, the connection terminals and the second PCB. Thus, the first semiconductor chip transfers, processes and/or stores signals output from the image sensor chip.

BRIEF DESCRIPTION OF THE DRAWINGS

The inventive concept will become more apparent in view of the attached drawings and detailed description that follows.

FIGS. 11A to 11G are cross-sectional views illustrating a method of manufacturing a semiconductor package, according to some examples of the inventive concept.

DETAILED DESCRIPTION

Figure 1:
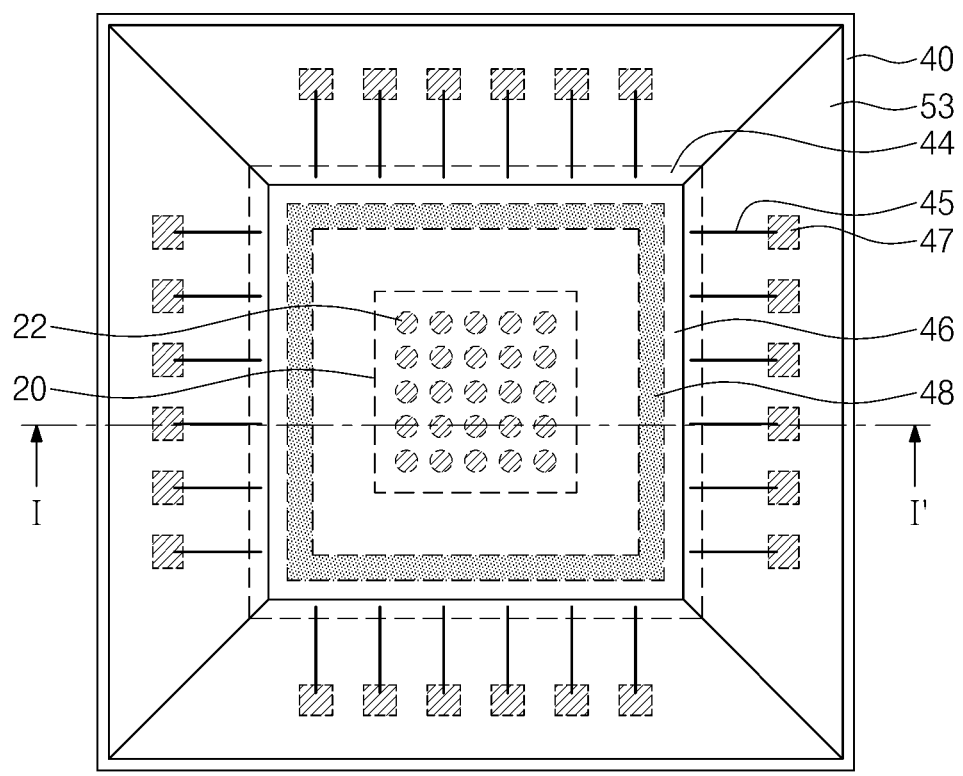
FIG. 1 is a plan view illustrating a semiconductor package according to some examples of the inventive concept.

The inventive concept will now be described more fully hereinafter with reference to the accompanying drawings, in which examples of the inventive concept are shown. The inventive concept may, however, be embodied in different forms and should not be constructed as limited to the examples set forth herein. Rather, these examples are provided so that this disclosure will be thorough and complete, and will fully convey the scope of the inventive concept to those skilled in the art. The same reference numerals or the same reference designators denote the same elements throughout the drawings.

Figure 2A:
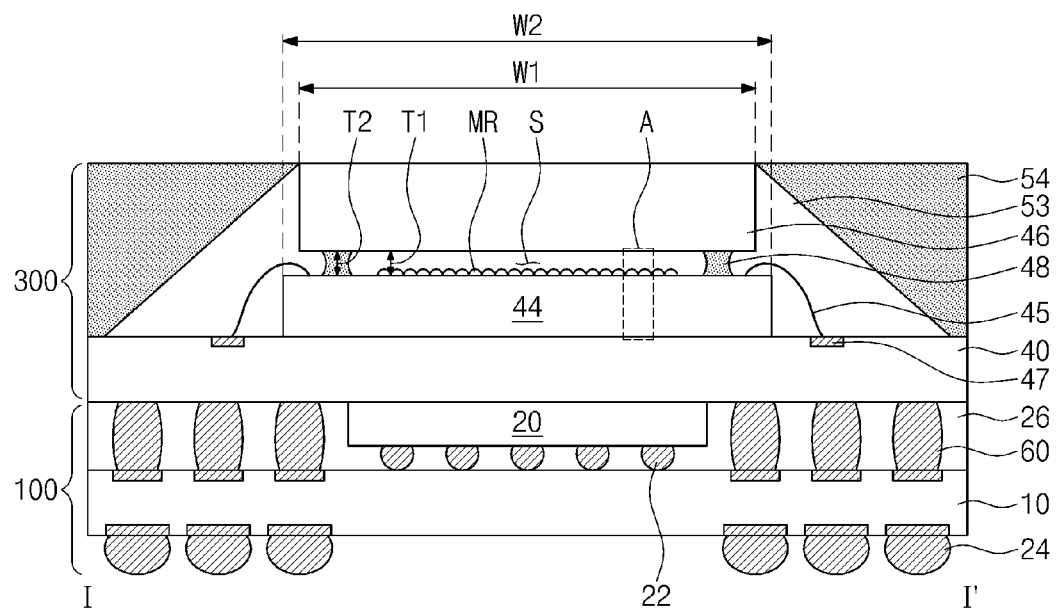
FIG. 2A is a cross-sectional view taken along line I-I' of FIG. 1 to illustrate a semiconductor package according to some examples of the inventive concept.
Figure 2B:
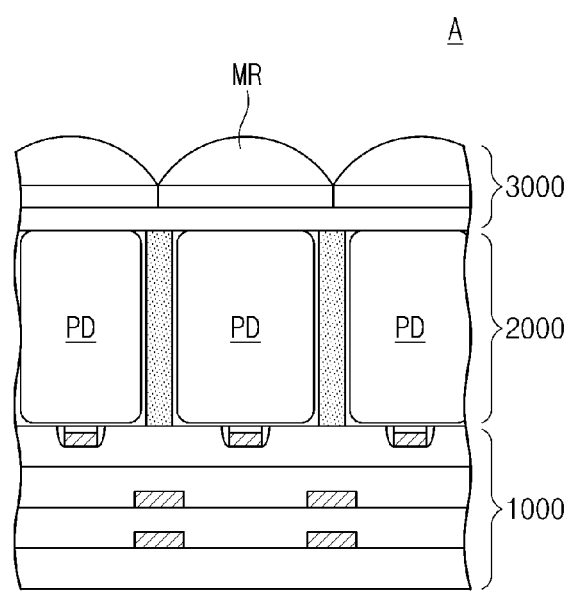
FIG. 2B is an enlarged view of portion 'A' of FIG. 2A.

FIG. 1 is a plan view illustrating a semiconductor package according to some examples of the inventive concept. FIG. 2A is a cross-sectional view taken along line I-I' of FIG. 1 to illustrate a semiconductor package according to some examples of the inventive concept. FIG. 2B is an enlarged view of portion 'A' of FIG. 2A.

Referring to FIGS. 1 and 2A, a semiconductor package may include a lower package 100 and an upper package 300 stacked on the lower package 100.

The lower package 100 may include a first package substrate 10 and a semiconductor chip 20 disposed on the first package substrate 10. The first package substrate 10 may include insulating layers, conductive vias, and conductive patterns. The insulating layers may be formed of a plastic material or a ceramic material. The conductive vias may extend vertically through respective ones of the insulating layers and the conductive patterns may be disposed between the insulating layers. For example, the first package substrate 10 may be a printed circuit board (PCB).

The semiconductor chip 20 may be mounted on a top surface of the first package substrate 10 by means of solder balls 22. The solder balls 22 may be disposed between the first package substrate 10 and the semiconductor chip 20. The solder balls 22 may be in contact with pads (not shown) disposed on the top surface of the first package substrate 10, and thus the semiconductor chip 20 may be electrically connected to the first package substrate 10 through the solder balls 22. The semiconductor chip 20 may include at least one of a memory device, a digital signal processor (DSP) integrated circuit, an application specific integrated circuit (ASIC), and an image sensor driver circuit, and may be bonded to the PCB in a flip chip manner such that an active surface of the semiconductor chip 20 faces the upper surface of the PCB.

A first molding layer 26 covering the semiconductor chip 20 may be disposed on the first package substrate 10. The first molding layer 26 may be disposed in a space between the semiconductor chip 20 and the first package substrate 10 and a space between the first package substrate 10 and the upper package 300. For example, the first molding layer 26 may include an epoxy resin-based material or polyimide.

In other examples, the first molding layer 26 is omitted. Thus, an empty space may exist between the lower package 100 and the upper package 300.

External terminals 24 may be disposed on a bottom surface of the first package substrate 10. The semiconductor package may be electrically connected to an external device (not shown) through the external terminals 24. For example, the external terminals 24 may comprise a metal (e.g., tin (Sn)).

The upper package 300 may include a second package substrate 40 and an image sensor chip 44 disposed on the second package substrate 40. The second package substrate 40 may include insulating layers formed of a plastic or ceramic material, and conductive vias extending vertically through respective ones of the insulating layers and conductive patterns extending horizontally at interfaces of the insulating layers. For example, the second package substrate 40 may be a printed circuit board (PCB). The printed circuit board (PCB) may have one or more insulating layers forming the substrate of the PCB itself, and conductive features (traces or wiring patterns and conductive pads, for example) exposed at the top and/or bottom of the PCB as extending along a major surface(s) of the substrate. In the above-described examples in which the substrate of the PCB has a plurality of insulating layers, the PCB also has interconnects such as vias and internal wiring layers on respective ones of the insulating layers. That is, the PCB may be a multi-layered PCB.

The image sensor chip 44 may be adhered to a top surface of the second package substrate 40 by an insulating adhesive (not shown) interposed therebetween.

Referring to FIG. 2B, the image sensor chip 44 of these examples includes a photoelectric conversion part 2000 having photoelectric conversion elements PD arranged in a matrix. The image sensor chip 44 may also include an interconnection part 1000 disposed on one surface of the photoelectric conversion part 2000, and a color filter part 3000 disposed on another surface, opposite to the one surface, of the photoelectric conversion part 2000. The photoelectric conversion elements PD may be any type of photoelectric conversion element known, per se, for converting incident light into electrical charges (e.g., a diode). The interconnection part 1000 may include insulating layers and interconnections disposed between the insulating layers, and may also include transistors that generate electrical signals corresponding to the charges that are generated by the photoelectric conversion elements PD. The interconnection part 1000 may be adjacent to the second package substrate 40. The color filter part 3000 may include color filters and micro lenses MR. The color filters may be disposed on the photoelectric conversion elements PD, respectively, and the micro lenses MR may be disposed on the color filters. Light may be made incident on the photoelectric conversion elements PD through the micro lenses MR, and charges corresponding to the incident light may be generated and accumulated in each of the photoelectric conversion elements PD.

Referring again to FIG. 2A, a transparent substrate 46 may be disposed on the image sensor chip 44. The transparent substrate 46 may be vertically stacked on the image sensor chip 44. The transparent substrate 46 may be a glass substrate or a plastic substrate. The transparent substrate 46 may have a width W1. The width W1 of the transparent substrate 46 may be smaller than a width W2 of the image sensor chip 44 in a common direction parallel to major surfaces of the substrates 44, 46 (W1<W2).

An adhesive pattern 48 may be disposed between the image sensor chip 44 and the transparent substrate 46. The adhesive pattern 48 may bond the transparent substrate 46 to the image sensor chip 44. The adhesive pattern 48 may extend along an edge of the transparent substrate 46 and may have a ring shape when viewed from above, i.e., in a plan view. Here, the term "ring" may refer to any closed loop such as the rectangular "ring" of adhesive (the adhesive pattern 48) shown in FIG. 1. The adhesive pattern 48 may include an epoxy resin-based material containing fillers. As illustrated in FIG. 2A, both inner and outer sides of the adhesive pattern 48 may be concave. However, the inventive concept is not limited to a particular shape of the side or sides of the adhesive pattern 48, i.e., the sides of the adhesive pattern 48 may have any of various shapes.

The adhesive pattern 48 may delimit (i.e., define a boundary of) an enclosed space S between the image sensor chip 44 and the transparent substrate 46. The space S may be empty, i.e., may be an air space. The micro lenses MR may be exposed in the space S. For example, a top surface of the micro lenses MR may be spaced apart from a bottom surface of the transparent substrate 46 by a distance T1 across the space S. The distance T1 may be smaller than or equal to a thickness T2 of the adhesive pattern 48 (T1≤T2). The distance T1 may range from about 100 µm to about 200 µm.

Considered another way, the adhesive pattern 48 may delimit the space S, along with the bottom surface of the transparent substrate 46 and the top surface of the photoelectric conversion part 2000 and the micro lenses MR may be disposed in the space S.

Figure 3:
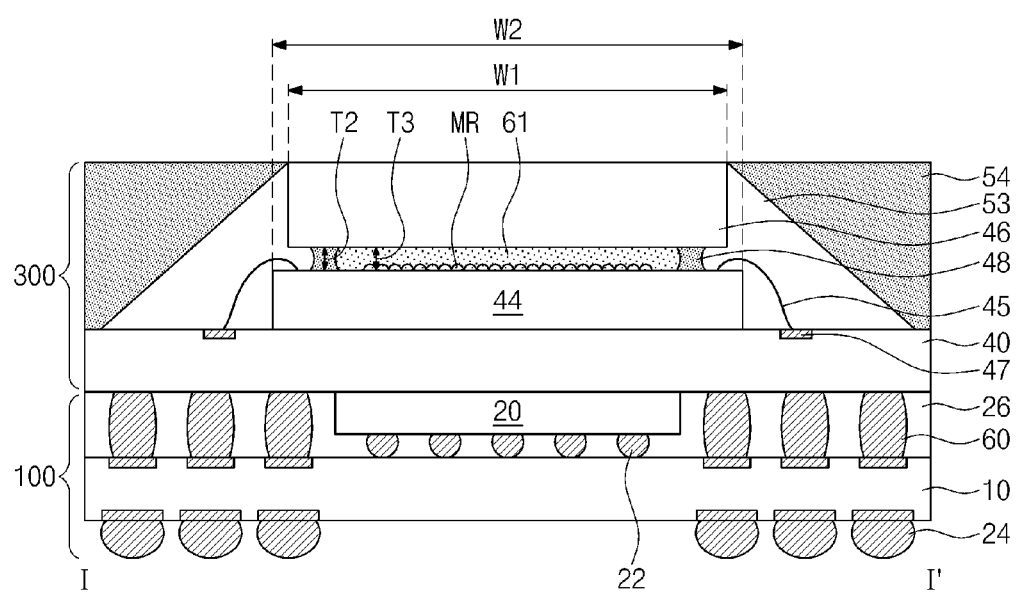
FIG. 3 is a cross-sectional view taken along line I-I' of FIG. 1 to illustrate a semiconductor package according to some examples of the inventive concept.

In other examples, a transparent resin layer 61 may be disposed between the image sensor chip 44 and the transparent substrate 46 and may be surrounded by the adhesive pattern 48, as illustrated in FIG. 3. The transparent resin layer 61 may have a thickness T3. The thickness T3 of the transparent resin layer 61 may be substantially equal to the thickness T2 of the adhesive pattern 48 (T2=T3). For example, the transparent resin layer 61 may include at least one of polymethylmethacrylate (PMMA), polycarbonate (PC), or a transparent polymer material (e.g., thermosetting transparent epoxy or transparent acrylonitrile butadiene styrene (ABS)).

Bonding wires 45 may be disposed on the second package substrate 40. The bonding wires 45 may be located outside the adhesive pattern 48 and may electrically connect chip pads (not shown) disposed on the top surface of the image sensor chip 44 to wire pads 47 of the second package substrate 40. Thus, the image sensor chip 44 may be electrically connected to the second package substrate 40 through the bonding wires 45. The bonding wires 45 may comprise a metal (e.g., gold (Au)).

A resin layer 53 may be disposed on the second package substrate 40. The resin layer 53 may cover the top surface of the second package substrate 40, an outer side surface of the image sensor chip 44, the side surface of the transparent substrate 46, an outer side surface of the adhesive pattern 48, and the bonding wires 45. The resin layer 53 may expose a top surface of the transparent substrate 46. The resin layer 53 may surround the transparent substrate 46 when viewed from above, i.e., in a plan view. The resin layer 53 may have inclined side surfaces, i.e., side surfaces inclined with respect to a vertical direction in which the upper package 300 is stacked on the lower package 100. The vertical distance between the top surface of the second package substrate 40 and the side surface of the resin layer 53 may gradually decrease as the distance in a horizontal direction away from the transparent substrate 46 increases. In other words, the resin layer 53 may taper in a vertically upward direction away from the second package substrate 40.

For example, the resin layer 53 may include an epoxy resin or silicon resin-based material, which contains at least one of silver (Ag), copper (Cu), or a non-metal inorganic material.

A second molding layer 54 may be disposed on the resin layer 53. The second molding layer 54 may surround the transparent substrate 46 on the resin layer 53 and may expose the top surface of the transparent substrate 46. A top surface of the second molding layer 54 may be coplanar with the top surface of the transparent substrate 46.

The second molding layer 54 may include the same material as the first molding layer 26. The elastic modulus of the second molding layer 54 may be smaller than that of the resin layer 53. Accordingly, the resin layer 53 may absorb external stress to prevent the image sensor chip 44, the adhesive pattern 48, the transparent substrate 46, the bonding wires 45, and interfaces therebetween from being damaged by the external stress.

Connection terminals 60 may be disposed between the lower package 100 and the upper package 300. The connection terminals 60 may be disposed in the first molding layer 26 and may be disposed around the semiconductor chip 20 in a plan view. The connection terminals 60 may electrically connect the substrate 40 of the upper package 300 to the substrate 10 of the lower package 100.

The semiconductor package according to some examples of the inventive concept may include the lower package 100 and the upper package 300 which are vertically stacked. The lower package 100 may include the transistors and the memory elements which transfer, process and store the signals transferred from the image sensor chip 44. The upper package 300 may include the image sensor chip 44. Thus, it a semiconductor package according to the inventive concept may include a highly integrated image sensor and yet may occupy a small planar area, i.e., may have a relatively small footprint.

Figure 4:
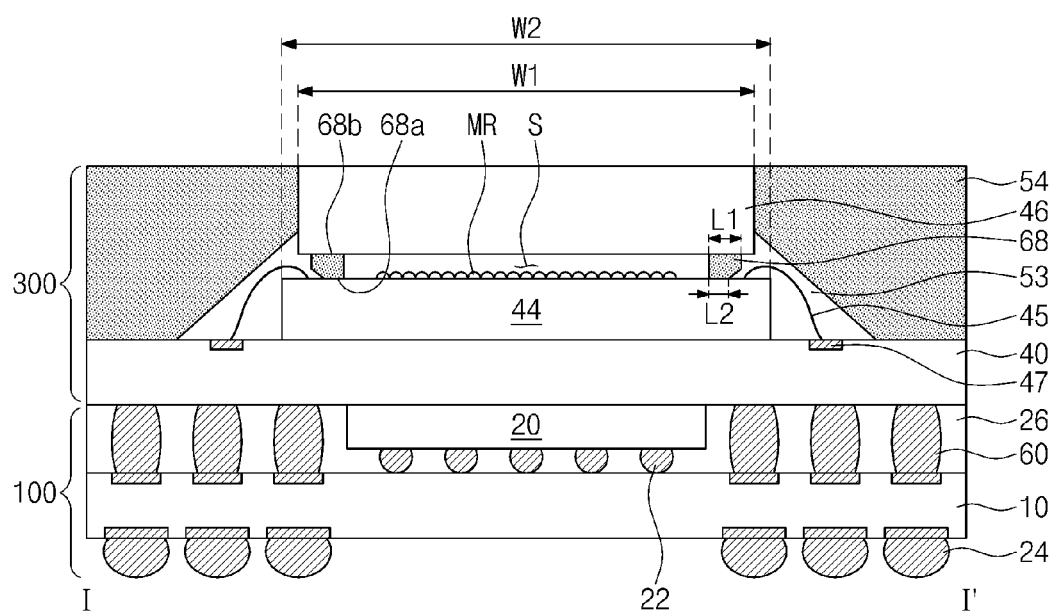
FIG. 4 is a cross-sectional view taken along line I-I' of FIG. 1 to illustrate a semiconductor package according to some examples of the inventive concept.

FIG. 4 is a cross-sectional view taken along line I-I' of FIG. 1 to illustrate a semiconductor package according to some examples of the inventive concept.

Referring to FIG. 4, the resin layer 53 disposed between the image sensor chip 44 and the transparent substrate 46 may cover the top surface of the second package substrate 40, the side surface of the image sensor chip 44, an outer side of an adhesive pattern 68, and the bonding wires 45, but a portion of the side surface and the top surface of the transparent substrate 48 may be exposed by the resin layer 53. The resin layer 53 may surround the transparent substrate 46 in a plan view. The resin layer 53 may have inclined side surfaces, i.e., side surfaces inclined with respect to a vertical direction in which the upper package 300 is stacked on the lower package 100. The vertical distance between the top surface of the second package substrate 40 and the side surface of the resin layer 53 may gradually decrease as the distance in a horizontal direction away from the transparent substrate 46 increases. In other words, the resin layer 53 may taper in a vertically upward direction away from the second package substrate 40.

The aforementioned adhesive pattern 68 may be disposed between the image sensor chip 44 and the transparent substrate 46. The adhesive pattern 68 may fix the transparent substrate 46 to the image sensor chip 44. The adhesive pattern 68 may extend along the edge of the transparent substrate 46 and may have a ring shape in a plan view, for example, so as to have an inner (radially inwardly facing) side and an outer (radially outwardly facing) side. The adhesive pattern 68 may include an epoxy resin-based material. The adhesive pattern 68 may be formed using a mold. Thus, the adhesive pattern 68 may have any of various shapes. Here, therefore, the term "inner side" will refer to the side of the adhesive pattern 68 that faces toward the centers of the lower and upper packages 100 and 300 whereas the term "outer side" will refer to the side of the adhesive pattern 68 that faces in the same direction as the outer sides of the lower and upper packages 100 and 300.

In the examples illustrated by FIGS. 1 and 4, the adhesive pattern 68 has a bottom surface 68a in contact with the image sensor chip 44 and a top surface 68b in contact with the transparent substrate 46. A width L1 of the top surface 68b of the adhesive pattern 68 is greater than a width L2 of the bottom surface 68a of the adhesive pattern 68 (each of the widths as shown in the figure being taken in a common horizontal direction perpendicular to a vertical direction in which the image sensor chip 44 is stacked on the second package substrate 40). In addition, at least part of the surface constituting the outer side of the adhesive pattern 68 adjacent to the resin layer 53 be inclined (extend obliquely) with respect to the bottom and top surfaces 68a and 68b of the adhesive pattern 68. The surface constituting the inner side of the adhesive pattern 68 facing the center of the packages 100 and 300 and delimiting the space S may be substantially perpendicular to the bottom and top surfaces 68a and 68b of the adhesive pattern 68.

The resin layer 53 of the examples illustrated by FIGS. 1 and 4 may cover a portion only of the side surface of the transparent substrate 46.

In some examples, the width L1 of the top surface 68b of the adhesive pattern 68 is greater than the width L2 of the bottom surface 68a of the adhesive pattern 68. Therefore, in these examples, a contact area between the adhesive pattern 68 and the transparent substrate 46 may be relatively large. Thus, the transparent substrate 46 may be stably fixed on the adhesive pattern 68. In addition, because a contact area between the image sensor chip 44 and the bottom surface 68a of the adhesive pattern 68 is smaller than the contact area between the transparent substrate 46 and the top surface 68b of the adhesive pattern 68, it is possible to maximize areas of portions, to which the bonding wires 45 are bonded, of the top surface of the image sensor chip 44. Furthermore, the adhesive pattern 68 may prevent the bonding wires 45 disposed outside the adhesive pattern 68 from being in contact with the micro lenses MR disposed inside the adhesive pattern 68.

Figure 5:
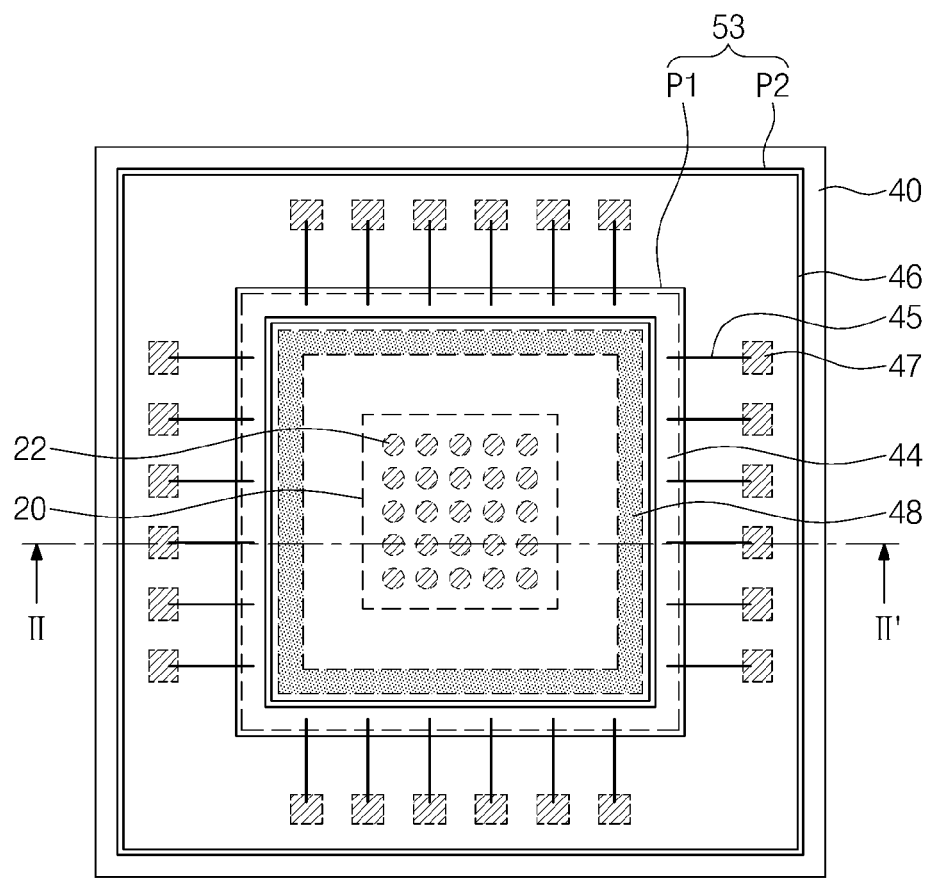
FIG. 5 is a plan view illustrating a semiconductor package according to some examples of the inventive concept.
Figure 6:
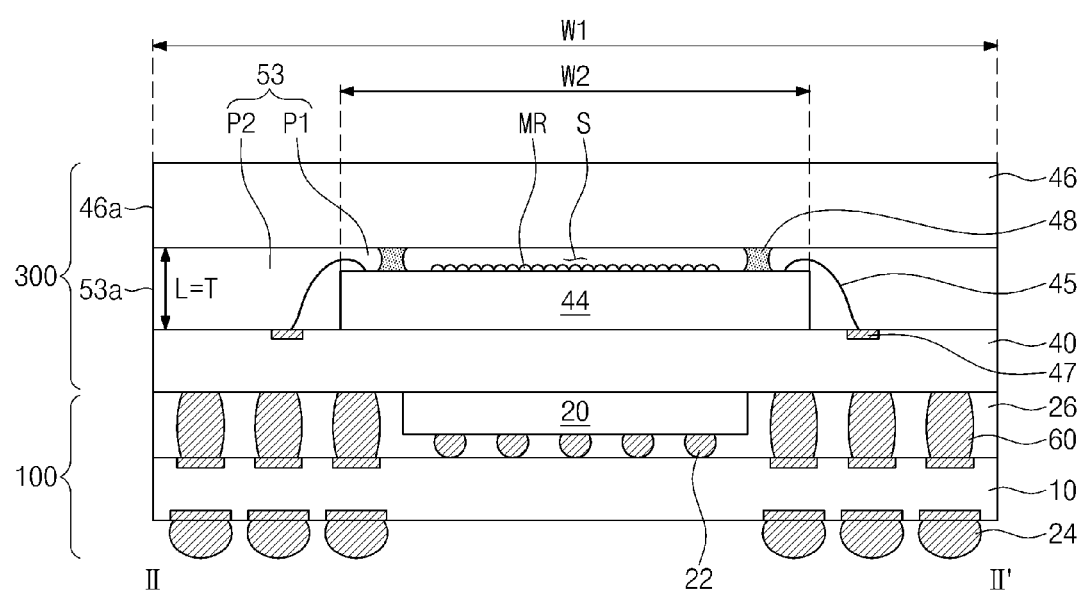
FIG. 6 is a cross-sectional view taken along line II-I' of FIG. 5 to illustrate a semiconductor package according to some examples of the inventive concept.

FIG. 5 is a plan view illustrating a semiconductor package according to some examples of the inventive concept. FIG. 6 is a cross-sectional view taken along line II-II' of FIG. 5 to illustrate a semiconductor package according to some examples of the inventive concept.

In the examples of FIGS. 5 and 6, width W1 of the transparent substrate 46 disposed on the image sensor chip 44 is greater than the width W2 of the image sensor chip 44 (W1>W2).

The resin layer 53 may be disposed between the second package substrate 40 and the transparent substrate 46. In more detail, the resin layer 53 may fill a space between the second package substrate 40 and the transparent substrate 46 to cover the top surface of the second package substrate 40, the side surface of the image sensor chip 44, a bottom surface of the transparent substrate 46, the outer side surface of the adhesive pattern 48, and the bonding wires 45. The resin layer 53 may surround the adhesive pattern 48 in a plan view. The resin layer 53 may be formed of material whose elastic modulus is greater than that of the first molding layer 26. For example, the first molding layer 26 may include an epoxy resin-based material or polyimide. For example, the resin layer 53 may include an epoxy resin or silicon resin-based material, which contains at least one of silver (Ag), copper (Cu), or a non-metal inorganic material.

The resin layer 53 may include a first portion P1 disposed between the image sensor chip 44 and the transparent substrate 46 and a second portion P2 disposed between the second package substrate 40 and the transparent substrate 46. A thickness T of the second portion P2 of the resin layer 53 may be equal to a distance L between the top surface of the second package substrate 40 and the bottom surface of the transparent substrate 46 (L=T). In addition, the thickness T of the second portion P2 of the resin layer 53 may be uniform. A side surface 53a of the resin layer 53 may be coplanar with a side surface 46a of the transparent substrate 46. Thus, the side surface 46a of the transparent substrate 46 may be exposed by the resin layer 53.

Figure 7:
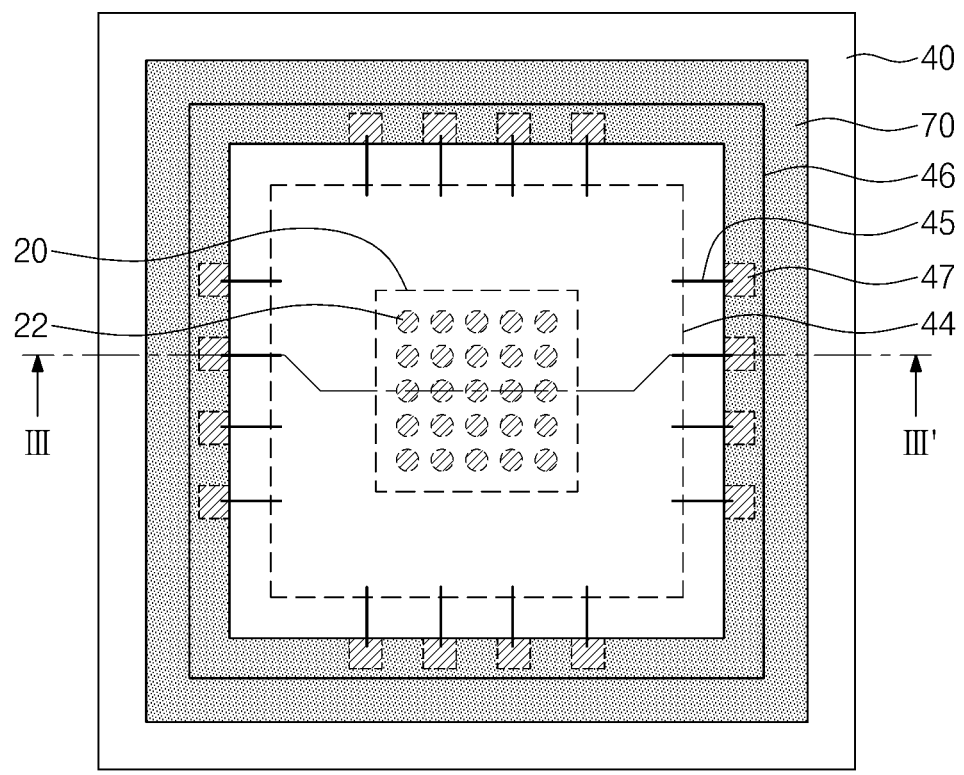
FIG. 7 is a plan view illustrating a semiconductor package according to some examples of the inventive concept.
Figure 8:
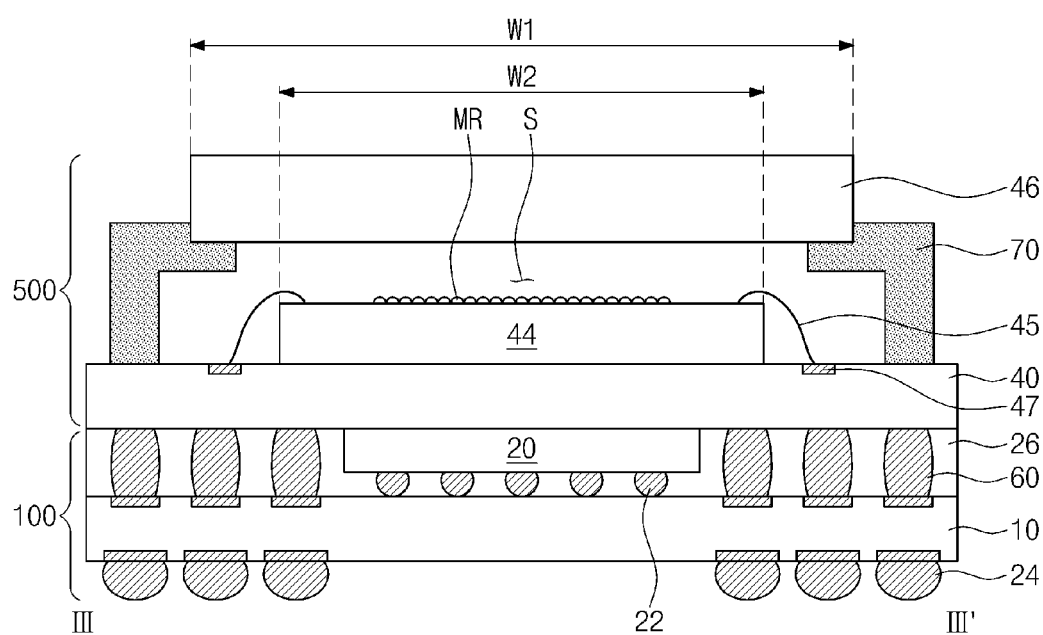
FIG. 8 is a cross-sectional view taken along line III-III' of FIG. 7 to illustrate a semiconductor package according to some examples of the inventive concept.

FIG. 7 is a plan view illustrating a semiconductor package according to some examples of the inventive concept. FIG. 8 is a cross-sectional view taken along line III-III' of FIG. 7 to illustrate a semiconductor package according to some examples of the inventive concept.

Referring to FIGS. 7 and 8, a semiconductor package may include the lower package 100 and an upper package 500 stacked on the lower package 100.

The upper package 500 may include the second package substrate 40, the image sensor chip 44 mounted on the second package substrate 40, the transparent substrate 46 disposed over the image sensor chip 44, and a support 70 disposed between the second package substrate 40 and transparent substrate 46.

The support 70 may be disposed on the top surface of an edge portion of the second package substrate 40. The support 70 may surround the image sensor chip 44 in a plan view. Thus, the image sensor chip 44 may be protected from an external environment by the support 70. The support 70 may include a dielectric material (e.g., a silicon polymer material). The support 70 may have the form of a bracket fixed to the second package substrate 40 and extending around the image sensor chip 44.

The transparent substrate 46 may be supported by the support 70 to vertically face the image sensor chip 44. The width W1 of the transparent substrate 46 may be greater than the width W2 of the image sensor chip 44 (W1>W2). The transparent substrate 46 may be supported by the support 70.

The support 70 along with the top surface of the image sensor chip 44, the top surface of the second package substrate 40 and the bottom surface of the transparent substrate 46 may delimit an enclosed space S which extends between the second package substrate 40 and the transparent substrate 46. The image sensor chip 44 may be disposed in the space S. In some examples, the space S is empty but for the presence therein of the image sensor chip 46 and boding wires 45, i.e., the space S includes an air space around the image sensor chip 46 and boding wires 45.

Figure 9:
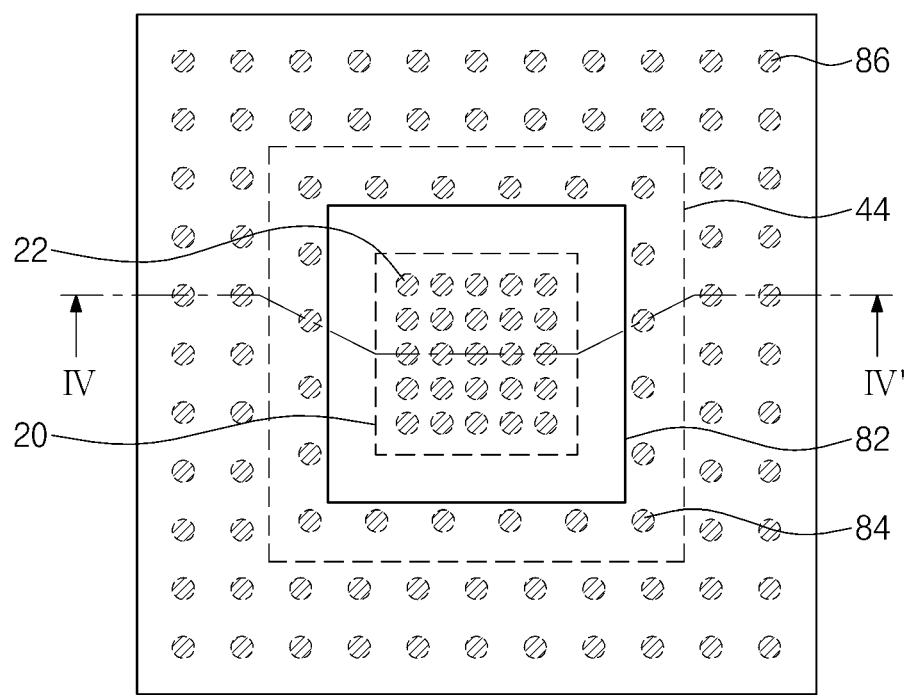
FIG. 9 is a plan view illustrating a semiconductor package according to some examples of the inventive concept.
Figure 10:
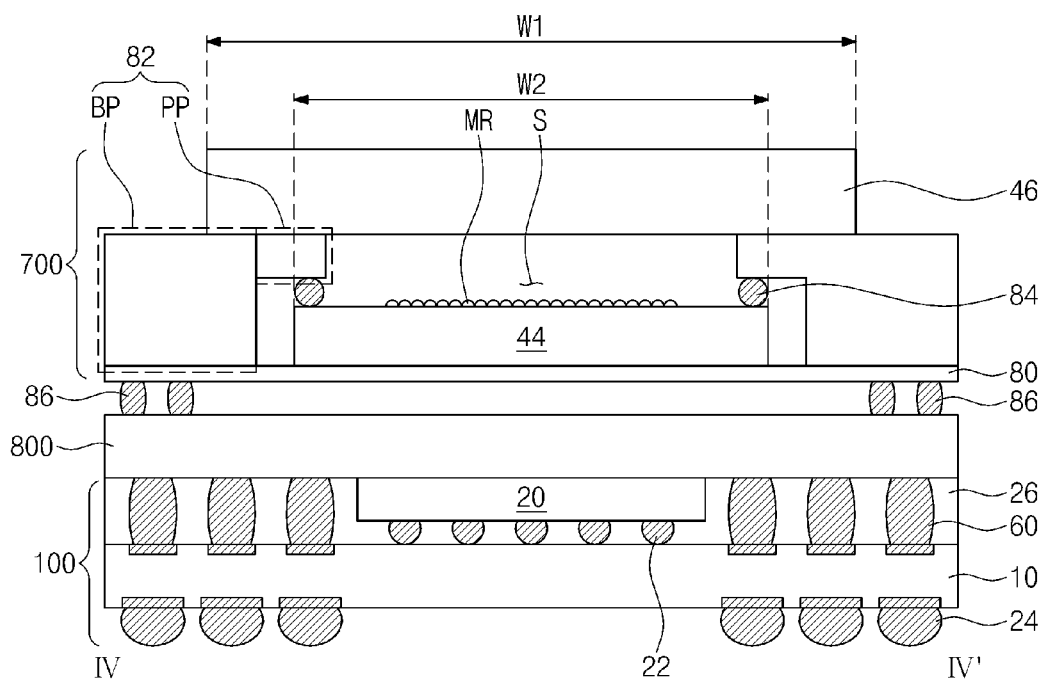
FIG. 10 is a cross-sectional view taken along line IV-IV' of FIG. 9 to illustrate a semiconductor package according to some examples of the inventive concept.

FIG. 9 is a plan view illustrating a semiconductor package according to some examples of the inventive concept. FIG. 10 is a cross-sectional view taken along line IV-IV' of FIG. 9 to illustrate a semiconductor package according to some examples of the inventive concept.

Referring to FIGS. 9 and 10, a semiconductor package may include the lower package 100, an interposer 800 disposed on the lower package 100, and an upper package 700 disposed on the interposer 800.

The interposer 800 may include insulating layers formed of a plastic or ceramic material, a through-via (not shown), interconnections (not shown), and/or pads (not shown). The pads disposed on a bottom surface of the interposer 800 may be in contact with the connection terminals 60. Thus, the interposer 800 may be electrically connected to the lower package 100.

The upper package 700 may include a PCB including a first PCB substrate 80 and a second PCB substrate 82 disposed on the first PCB substrate 80, the image sensor chip 44 disposed on the first PCB substrate 80, and the transparent substrate 46 disposed on the second PCB substrate 82.

Terminals 86 may be disposed on a bottom surface of the first PCB substrate 80. The terminals 86 may be in contact with the pads disposed on a top surface of the interposer 800. Thus, the interposer 800 may be electrically connected to the upper package 700.

The image sensor chip 44 may be mounted on a top surface of the first PCB substrate 80. The image sensor chip 44 may be adhered to the top surface of the first PCB substrate 80 by an insulating adhesive (not shown) interposed therebetween. Solder balls 84 may be disposed on the top surface of the image sensor chip 44. The solder balls 84 may be arranged along an edge of the image sensor chip 44 in a plan view.

The second PCB substrate 82 may be disposed on the top surface of an edge portion of the first PCB substrate 80. The second PCB substrate 82 may surround the image sensor chip 44 and may have a ring shape in a plan view. The second PCB substrate 82 may include a body portion BP and a protruding portion PP protruding from an inner side surface of an upper portion of the body portion BP toward the image sensor chip 44. The protruding portion PP of the second PCB substrate 82 may cover an edge portion of the image sensor chip 44. The solder balls 84 may be disposed between a bottom surface of the protruding portion PP of the second PCB substrate 82 and the top surface of the image sensor chip 44. The solder balls 84 may electrically connect the image sensor chip 44 to the second PCB substrate 82.

Bumps (not shown) may be provided on a bottom surface of the body portion BP of the second PCB substrate 82. The bumps may be in contact with interconnections (not shown) exposed at the top surface of the first PCB substrate 80. Thus, the second PCB substrate 82 may be electrically connected to the first PCB substrate 80.

The transparent substrate 46 may be disposed on the second PCB substrate 82. The transparent substrate 46 may be fixed on the second PCB substrate 82 and may face the top surface of the image sensor chip 44.

The second PCB substrate 82 along with the top surface of the image sensor chip 44 and the bottom surface of the transparent substrate 46 may delimit an enclosed space S that extends between the image sensor chip 44 and the transparent substrate 46. In some examples, the space S may be an empty space, i.e., may be air space. Or thought of another way, the first PCB 80, the second PCB 82 and the transparent substrate 46 may delimit enclosed space S and the image sensor chip 44 is disposed in the space S.

FIGS. 11A to 11G are cross-sectional views illustrating a method of manufacturing a semiconductor package, according to some examples of the inventive concept.

First, a method of manufacturing a lower package will be described with reference to FIGS. 11A to 11C.

Figure 11A:
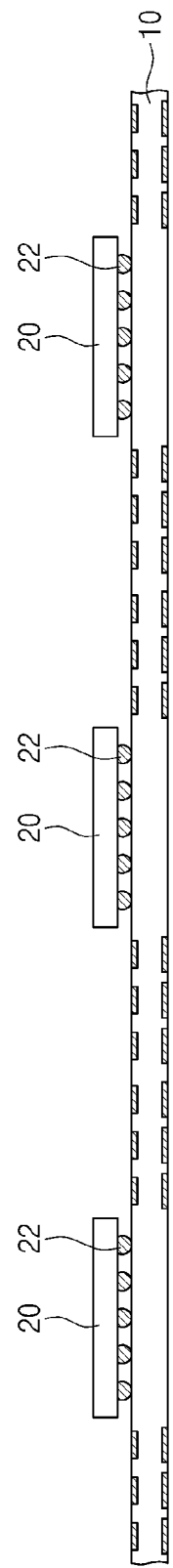

Referring to FIG. 11A, a first package substrate 10 may be prepared. The first package substrate 10 may include insulating layers, conductive vias, and conductive patterns. The insulating layers may be formed of a plastic material or a ceramic material. The conductive vias may extend vertically through respective ones of the insulating layers and the conductive patterns may be disposed between the insulating layers. For example, the first package substrate 10 may be a printed circuit board (PCB).

Solder balls 22 may be formed on the first package substrate 10. The solder balls 22 may be formed on pads (not shown) disposed on a top surface of the first package substrate 10. The solder balls 22 may be formed using a screen print technique, an ink-jet technique, or a soldering technique. The solder balls 22 may include a conductive material such as a metal.

A semiconductor chip 20 may be bonded or adhered to the solder balls 22. Thus, the semiconductor chip 20 may be mounted on the first package substrate 10. In certain examples, the solder balls 22 may be formed on one surface of the semiconductor chip 20, and then the semiconductor chip 20 may be mounted on the first package substrate 10 by a flip-chip bonding method in such a way that the solder balls 22 are bonded to the active surface of the chip 20 and the top surface of the first package substrate 10. The semiconductor chip 20 may be electrically connected to the first package substrate 10 through the solder balls 22. In some examples, as illustrated in FIG. 11A, the first package substrate 10 may include a plurality of chip regions, and a plurality of the semiconductor chips 20 may be mounted on the chip regions of the first package substrate 10, respectively. For example, the semiconductor chip 20 may include at least one semiconductor device selected from the group consisting of a memory device, a digital signal processor integrated circuit, an application specific integrated circuit, and a driver.

Figure 11B:
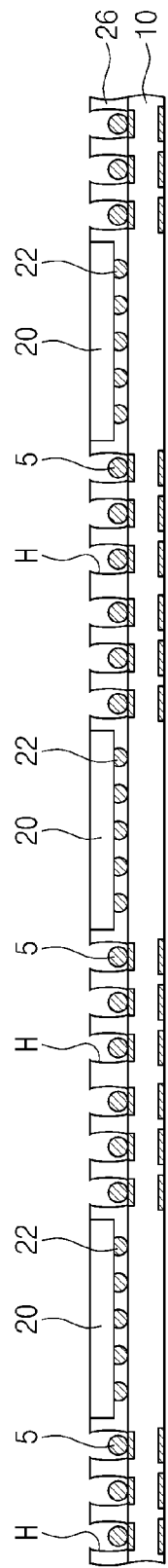

Referring to FIG. 11B, first terminals 5 may be formed on the first package substrate 10. The first terminals 5 may be formed around the semiconductor chip 20 in a plan view. The first terminals 5 may be formed using a screen print technique, an ink-jet technique, or a soldering technique. As illustrated in FIGS. 11A and 11B, the first terminals 5 may be formed after the formation of the solder balls 22. Alternatively, the first terminals 5 may be formed simultaneously with the solder balls 22. In this case, the first terminals 5 and the solder balls 22 may have the same size.

A first molding layer 26 may be formed on the first package substrate 10. The first molding layer 26 may cover the top surface of the first package substrate 10 and the semiconductor chip 20 and may fill a space between the semiconductor chip 20 and the first package substrate 10. For example, the first molding layer 26 may be formed using a molded under fill (MUF) process. For example, the first molding layer 26 may include an epoxy resin-based material or polyimide.

A planarization process may be performed on a top surface of the first molding layer 26. Thus, a top surface of the semiconductor chip 20 may be exposed by the first molding layer 26. For example, the planarization process may be a chemical mechanical polishing (CMP) process.

A laser drilling process may be performed on the top surface of the first molding layer 26. Openings H respectively exposing the first terminals 5 may be formed in the first molding layer 26 by the laser drilling process.

In certain examples, even though not shown in the drawings, the first terminals 5 may be formed in the openings H after the formation of the openings H. In certain examples, even though not shown in the drawings, the openings H may be filled with solder paste instead of the first terminals 5 after the formation of the openings H.

Figure 11C:
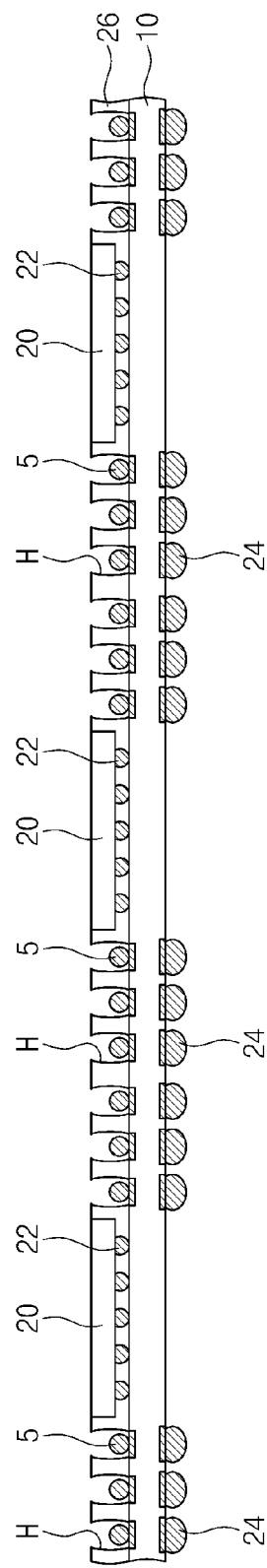

Referring to FIG. 11C, external terminals 24 may be formed on a bottom surface of the first package substrate 10. For example, the external terminals 24 may be formed using a soldering process. As a result, a plurality of lower packages may be manufactured to respectively include the plurality of semiconductor chips 20 disposed on the first package substrate 10.

A method of manufacturing an upper package will be described with reference to FIGS. 11D to 11F.

Figure 11D:
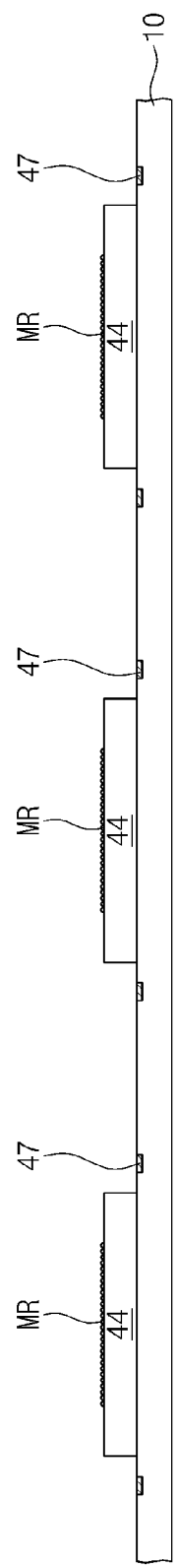

Referring to FIG. 11D, a second package substrate 40 may be prepared. The second package substrate 40 may include insulating layers formed of a plastic or ceramic material, and conductive vias extending vertically through respective ones of the insulating layers and conductive patterns extending horizontally at interfaces of the insulating layers. Wire pads 47 may be provided on a top surface of the second package substrate 40. For example, the second package substrate 40 may be a printed circuit board (PCB).

An image sensor chip 44 may be mounted on the top surface of the second package substrate 40. The image sensor chip 44 may be adhered or bonded to the top surface of the second package substrate 40 by an insulating adhesive (not shown) interposed therebetween. The image sensor chip 44 may include the photoelectric conversion elements PD and the micro lenses MR of FIG. 2B. In some examples, the second package substrate 40 may include a plurality of chip regions, and a plurality of the image sensor chips 44 may be mounted on the chip regions of the second package substrate 40, respectively, as illustrated in FIG. 11D.

Referring to FIG. 11E, a transparent substrate 46 may be adhered to a top surface of the image sensor chip 44 by an adhesive pattern 48 interposed therebetween. In some examples, adhering the transparent substrate 46 to the image sensor chip 44 may include providing a liquid adhesive material onto an edge portion of one surface of the transparent substrate 46, adhering the adhesive material to the top surface of the image sensor chip 44, and performing a curing process to harden the adhesive material to form the adhesive pattern 48 between the image sensor chip 44 and the transparent substrate 46. Because the adhesive pattern 48 is formed by hardening the liquid adhesive material, the side surface of the adhesive pattern 48 may be concave.

A space S may be defined between the image sensor chip 44 and the transparent substrate 46 by the adhesive pattern 48. The space S may be filled with air.

Bonding wires 45 may be formed on the second package substrate 40. First ends of the bonding wires 45 may be formed on the top surface of the image sensor chip 44, and second ends of the bonding wires 45 may be formed on the wire pads 47 disposed on the top surface of the second package substrate 40. Thus, the image sensor chip 44 may be electrically connected to the second package substrate 40 through the bonding wires 45. The bonding wires 45 may include a metal (e.g., gold (Au)).

Referring to FIG. 11F, a resin layer 53 may be formed on the second package substrate 40 having the transparent substrate 46. The resin layer 53 may be formed to surround a side surface of the transparent substrate 46. In some examples, a liquid resin material may be provided to cover the side surface of the image sensor chip 44, the side surface of the transparent substrate 46, an outer side surface of the adhesive pattern 48, the bonding wires 45, and the top surface of the second package substrate 40. Subsequently, a curing process may be performed to harden the liquid resin material to form the resin layer 53. The liquid resin material may be provided using a dispensing process. The resin layer 53 may expose a top surface of the transparent substrate 46. The adhesive pattern 48 may prevent the liquid resin material from permeating into the empty space S, and thus the resin layer 53 may not be formed in the empty space S. For example, the resin layer 53 may include an epoxy resin or silicon resin-based material, which contains at least one of silver (Ag), copper (Cu), or a non-metal inorganic material.

A second molding layer 54 may be formed on the resin layer 53. The second molding layer 54 may cover a side surface of the resin layer 53 and may fill a space between the resin layers 53 adjacent to each other. For example, the second molding layer 54 may include an epoxy resin-based material or polyimide.

A planarization process may be performed on the second molding layer 54. Thus, a top surface of the second molding layer 54 may be coplanar with a top surface of the transparent substrate 46. For example, the planarization process may be a chemical mechanical polishing (CMP) process.

Second terminals 7 may be formed on a bottom surface of the second package substrate 40. The second terminals 7 may be formed using a screen print technique, an ink-jet technique, or a soldering technique. As a result, a plurality of upper packages may be manufactured to respectively include the plurality of image sensor chips 44 disposed on the second package substrate 40.

Figure 11G:
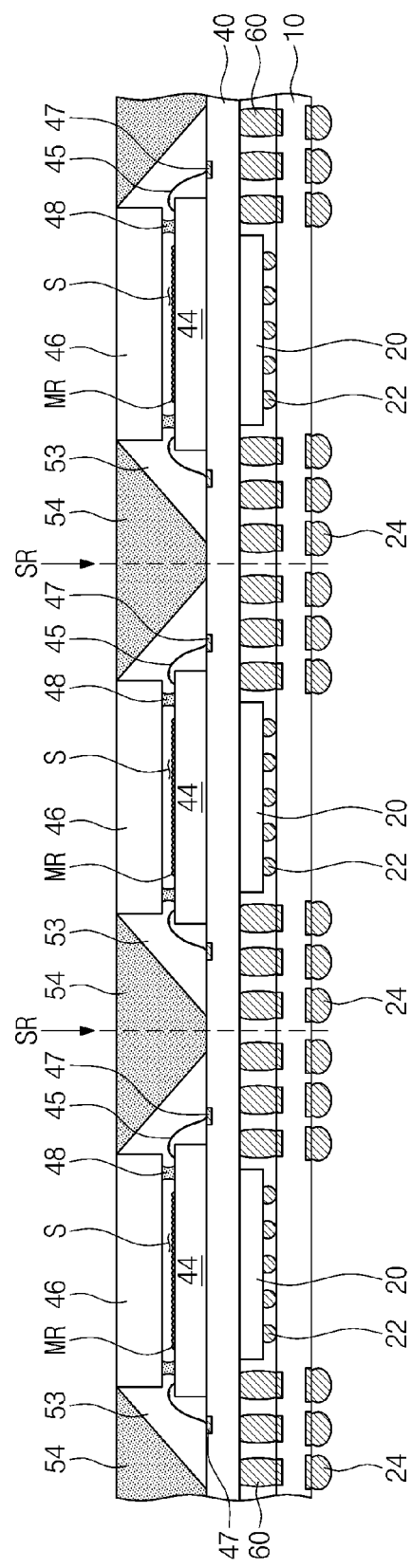

Referring to FIG. 11G, the upper packages may be stacked on the lower packages. In more detail, the second terminals 7 formed on the bottom surface of the second package substrate 40 may be inserted into the openings H (FIG. 11C) exposing the first terminals 5 of FIG. 11C. A reflow process may be performed to bond the second terminals 7 to the first terminals 5 in the openings H, respectively. Thus, the first terminals 5 and the second terminals 7 may be melted and combined with each other to form connection terminals 60. The connection terminals 60 may fill the openings H, respectively.

According to some examples of the inventive concept, the distance between the image sensor chip 44 and the transparent substrate 46 (i.e., a height of the space S) may be minimized to in turn minimize the expansion of air in the space S, caused by a high-temperature process. Thus, it is possible to inhibit or prevent the upper package from being damaged.

The second molding layer 54, the second package substrate 40, the first molding layer 26, and the first package substrate 10 may be sequentially cut along a scribe region SR between semiconductor packages each of which includes vertically stacked lower and upper packages. Thus, the semiconductor packages may be separated from each other.

According to some examples of the inventive concept, the semiconductor package may include the lower package and the upper package stacked on the lower package. The lower package may include the transistors and the memory elements which transfer, process and store signals, and the upper package may include the image sensor chip. Thus, a semiconductor package including a highly integrated image sensor may be realized.

Although the inventive concept has been described with reference to various examples, it will be apparent to those skilled in the art that various changes and modifications may be made to the examples without departing from the spirit and scope of the inventive concept. Therefore, it should be understood that the above examples are not limiting, but illustrative. Thus, the scope of the inventive concept shall not be restricted or limited by the foregoing description but is to be determined based on the broadest permissible interpretation of the following claims.

What is claimed is:
1. A semiconductor package device comprising:
a first semiconductor package comprising a first package substrate having an upper surface and a lower surface, and a semiconductor chip disposed on the upper surface of the first package substrate;

a second semiconductor package stacked on the first semiconductor package, the second semiconductor package comprising a second package substrate having an upper surface and a lower surface that faces toward the first semiconductor package, an image sensor chip disposed on a region of the upper surface of the second package substrate, a transparent substrate disposed on the image sensor chip, a pattern of adhesive interposed between the image sensor chip and the transparent substrate, and a resin layer disposed on the second package substrate in contact with the upper surface of the second package substrate at a location laterally outwardly of the image sensor chip; and wherein the semiconductor chip of the first semiconductor package has a first surface facing towards the first package substrate and a second surface facing towards the second semiconductor package, the transparent substrate has a top surface, a bottom surface facing towards the image sensor chip, and a side surface extending from the bottom surface to the top surface, the pattern of adhesive has a bottom surface in contact with the image sensor chip, and a top surface in contact with the bottom surface of the transparent substrate, and the resin layer has a side surface extending from the transparent substrate to the upper surface of the second package substrate at location laterally of the image sensor chip, and extends around the image sensor chip, pattern of adhesive and at least a lower part of the transparent substrate.

2. The semiconductor package device of claim 1, wherein a distance between a top surface of the second package substrate and the side surface of the resin layer gradually decreases as a horizontal distance from the transparent substrate increases.

3. The semiconductor package device of claim 1, wherein the side surface of the resin layer is inclined with respect to a vertical direction.

4. The semiconductor package device of claim 1, wherein a width of the image sensor chip is greater than that of the transparent substrate.

5. The semiconductor package device of claim 1, wherein the pattern of adhesive extends in a ring alongside an outer peripheral edge of the transparent substrate, and the pattern of adhesive delimits a space between the image sensor chip and the transparent substrate, and air occupies the space.

6. The semiconductor package device of claim 1, wherein the pattern of adhesive extends in a ring alongside an outer peripheral edge of the transparent substrate, and further comprising a transparent epoxy layer occupying a space delimited by the adhesive pattern between the image sensor chip and the transparent substrate.

7. The semiconductor package device of claim 1, wherein a top surface and at least an upper part of the side surface of the transparent substrate are not covered by the resin layer.

8. The semiconductor package device of claim 1, wherein the top surface of the transparent substrate is not covered by the resin layer, and the resin layer covers the entire side surface of the transparent substrate from the bottom surface to the top surface of the transparent substrate.

9. The semiconductor package device of claim 1, wherein the first semiconductor package further comprises: solder balls interposed between the first package substrate and the semiconductor chip, and the second semiconductor package further comprises: bonding wires electrically connecting the image sensor chip to the second package substrate, the semiconductor package device further comprising:
connection terminals extending between the first semiconductor package and the second semiconductor package and electrically connecting the first and second semiconductor packages to each other.

10. The semiconductor package device of claim 1, wherein a width of the top surface of the adhesive pattern is greater than a width of the bottom surface of the adhesive pattern.

11. The semiconductor package device of claim 1, wherein the resin layer also contacts at least part of the side surface of the transparent substrate.

12. The semiconductor package device of claim 1, wherein the second semiconductor package further comprises: a molding layer disposed on the resin layer and extending around the transparent substrate, and wherein a top surface of the molding layer is coplanar with a top surface of the transparent substrate.

13. The semiconductor package device of claim 12, wherein the elastic modulus of the resin layer is greater than that of the molding layer.

14. A semiconductor package device comprising:
a first semiconductor package comprising a first package substrate and a semiconductor chip stacked on the first package substrate; and a second semiconductor package stacked on the first semiconductor package, the second semiconductor package comprising a second package substrate, an image sensor chip stacked on the second package substrate, a transparent substrate disposed on the image sensor chip, a pattern of adhesive interposed between the image sensor chip and the transparent substrate, a resin layer disposed on the second package substrate and extending around the transparent substrate, and a molding layer disposed on the resin layer and extending around the transparent substrate, wherein the pattern of adhesive has a bottom surface in contact with the image sensor chip, and a top surface in contact with the bottom surface of the transparent substrate, and a top surface of the molding layer is coplanar with a top surface of the transparent substrate.

15. The semiconductor package device of claim 14, wherein the elastic modulus of the resin layer is greater than that of the molding layer.

16. A semiconductor package device comprising:
a first semiconductor package comprising a first printed circuit board (PCB) having a top surface and a bottom surface, a first semiconductor chip disposed on and flip-chip bonded to the top surface of the first PCB such that an active surface of the semiconductor chip faces the top surface of the first PCB, and connection terminals disposed laterally of the first semiconductor chip and electrically connected to the first PCB at the top surface of the first PCB; and a second semiconductor package stacked on and physically connected to the first semiconductor package, the second semiconductor package comprising a second printed circuit board (PCB) having a top surface and a bottom surface that faces the first semiconductor package and at which the second PCB is electrically connected to the connection terminals of the first semiconductor package, an image sensor chip disposed on the second PCB and electrically connected to the second PCB, and a transparent substrate disposed over the image sensor chip as spaced vertically therefrom, wherein the first semiconductor chip comprises at least one semiconductor device selected from the group consisting of a semiconductor memory device, a digital signal processor (DSP), an application specific integrated circuit (ASIC), and an image sensor driver circuit, and the first semiconductor chip is electrically connected to the image sensor chip via the first PCB, the connection terminals and the second PCB, whereby the first semiconductor chip transfers, processes and/or stores signals output from the image sensor chip.

17. The semiconductor package device of claim 16, wherein the second semiconductor package further comprises a ring of adhesive interposed between the image sensor chip and the transparent substrate as disposed in contact with a top surface of the image sensor chip and a bottom surface of the transparent substrate, a radially inner side surface of the ring of adhesive delimiting an enclosed space between the image sensor chip and the transparent substrate.

18. The semiconductor package device of claim 17, wherein the second semiconductor package further comprises a layer of resin disposed on the second PCB and covering side surfaces of the image sensor chip and a radially outer side surface of the ring of adhesive.

19. The semiconductor package device of claim 16, wherein the second semiconductor package further comprises a support in the form of a bracket disposed on the second PCB, the support extending around the image sensor chip and supporting the transparent substrate over the image sensor chip, and the bracket delimiting an enclosed space between the second PCB and the transparent substrate.

20. The semiconductor package device of claim 16, wherein the second PCB is a multi-layered PCB including a lower substrate on which the image sensor chip is disposed and an upper substrate disposed on the lower substrate and extending around the image sensor chip, the image sensor chip is electrically connected to the second PCB at the upper substrate of the second PCB the transparent substrate is disposed on the upper substrate of the second PCB, and the upper substrate of the second PCB delimits an enclosed space between the lower substrate of the second PCB and the transparent substrate.

* * * * *